United States Patent [19]

Yamashita et al.

[11] 4,220,885
[45] Sep. 2, 1980

[54] TUNING FORK MOUNTING WITH DAMPING MEANS

[75] Inventors: Yoshimasa Yamashita, Kameoka; Takeshi Nakamura, Uji, both of Japan

[73] Assignee: Murata Manufacturing Co., Ltd., Japan

[21] Appl. No.: 18,229

[22] Filed: Mar. 7, 1979

[30] Foreign Application Priority Data

Mar. 17, 1978 [JP] Japan .................... 53/35068[U]

[51] Int. Cl.³ ............................ H01L 41/08
[52] U.S. Cl. .................... 310/321; 310/26; 310/326; 310/370; 310/351
[58] Field of Search ............ 310/25, 321, 326, 370, 310/351-353; 58/23 TF; 333/200

[56] References Cited

U.S. PATENT DOCUMENTS

| | | |
|---|---|---|
| 3,106,124 | 10/1963 | Asten .................. 310/25 X |
| 3,480,809 | 11/1969 | Grib ..................... 310/25 |
| 3,501,910 | 3/1970 | Clifford ................ 310/25 X |
| 3,984,790 | 10/1976 | Tanaka ................. 310/321 X |
| 3,986,150 | 10/1976 | Tanaka et al. ........ 310/321 X |

FOREIGN PATENT DOCUMENTS 2267160  12/1975  France .................. 58/23 TF

*Primary Examiner*—Mark O. Budd

[57] ABSTRACT

A tuning fork wherein a tuning fork vibrator is supported on a damping member mounted in a housing and having such characteristics that it will cancel the $(\frac{1}{2})f_0$ of spurious response of the tuning fork vibrator without impeding the normal vibration of the tuning fork vibrator, whereby the size of the tuning fork can be minimized.

9 Claims, 18 Drawing Figures

TUNING FORK MOUNTING WITH DAMPING MEANS

BACKGROUND OF THE INVENTION

The present invention relates to a tuning fork and, more particularly to a tuning fork of small size wherein a tuning fork vibrator is supported on a housing by a damping member for cancelling the spurious response caused in the vicinity of $\frac{1}{2}$ of its natural frequency $f_0$.

It is well known that a tuning fork vibrator which consists of a pair of metal, vibratory reeds extending from the end of a stem, when struck, emits a tone of fixed pitch. The tuning fork vibrator, when excited by the input signal, is caused to vibrate at its natural or fundamental frequency, and thus only that signal having a frequency which is equal to the fundamental frequency is obtained at the output. Therefore, such tuning fork vibrators are widely used as tuning fork oscillators for the purpose of oscillating the tuning fork upon the application of an amplified electrical signal which is converted to the natural frequency of the tuning fork vibrator, and, also as a filtering element in an arrangement known as an electromechanical reed filter for the purpose of passing the frequency component of an electrical signal corresponding to the natural frequency of the tuning fork. In general, the tuning fork vibrator is provided with a pair of electro-mechanical transducers such as piezoelectric elements, one for causing vibrations on application of an input signal and the other for converting the vibration at the natural frequency of the tuning fork vibrator into an electrical signal.

As shown in FIG. 1, there is a tuning fork of conventional type comprising a tuning fork vibrator 1 of U shape including a pair of reeds 1a, 1b and a stem 1c; a housing 2 for accommodating the tuning fork vibrator 1, including a mounting base 3 provided with terminals 4, 5 and a case 6; a pair of piezoelectric elements 7a, 7b made of barium titanate ($BaTiO_3$), which are provided on the vibrating node section or its vicinity of the vibrating reeds 1a, 1b of the tuning fork vibrator 1 and connected to the terminals of the base 3; and a metal rod 8 mounted on the base 3 for supporting the stem 1c of the tuning fork vibrator 1 at its end so as to function as a common terminal for the tuning fork vibrator 1. The tuning fork is driven by an electrical signal applied between the metal rod 8 and one terminal, so that the output signal may be obtained from the other terminal.

In accordance with the trend of recent years to minaturizing many electronic parts as much as possible for use in increasingly compact appliances it is desirable to reduce the size of the tuning fork.

To make the tuning fork smaller without changing its configuration, the ratio of the weight of the tuning fork vibrator 1 to the total weight of the tuning fork is increased in order to make more simple the construction of the housing and the arrangement for mounting the tuning fork vibrator 1 within the housing 2. Similarly, the area of the piezoelectric elements 7a, 7b in comparsion with the size of the tuning fork is increased. As shown in FIG. 2, when the vibrating reeds 1a, 1b of the tuning fork vibrator 1 vibrate, during one half period of the vibration the vibrating pieces 1a, 1b are moving toward each other, while during the other half period of the vibration, the vibrating pieces 1a, 1b are moving apart; as indicated by arrows S. Since the weight of parts such as the housing 2 and mounting arrangement, other than the tuning fork vibrator 1, is relatively small in comparison with that of the tuning fork vibrator 1, the parts other than the vibrator 1 are caused to vibrate rotationally about the metal rod 8, as indicated by arrows T and U, which show the directions of the vibrations of the tuning fork vibrator 1 and of the remaining parts, respectively. In other words, during half period of the vibration both vibrating reeds 1a, 1b of the tuning fork vibrator 1 are moving in the direction of arrow $T_1$ while all the remaining parts vibrate in the opposite direction of arrow $U_1$, and, then, during the other half period of the vibration, both vibrating reeds 1a, 1b of the tuning fork vibrator 1 are moving in the direction of arrow $T_2$ while all the remaining parts vibrate in the direction of arrow $U_2$. Accordingly, vibrations of two kinds, one depending on the vibrating reeds 1a, 1b and the other depending on the remaining parts, resulting in a kind of twisting motion or torsional vibration between the tuning fork vibrator and the remaining parts to generate a so-called ($\frac{1}{2}$)$f_0$ spurious response in the vicinity of one half of the natural frequency $f_0$ of the tuning fork vibrator, as shown in FIG. 3, with the degree of damping being related to the frequency of the tuning fork vibrator. Such a ($\frac{1}{2}$)$f_0$ spurious response caused degrades the characteristics of the tuning fork damages it structurally particularly the mounting arrangement and terminal connection of the tuning fork vibrator. Thus satisfactory miniaturized tuning forks are hard to design and manufacture.

Accordingly, the present invention has for its essential object to provide a tuning fork of the above type without the disadvantages inherent in the conventional design and without the so-called ($\frac{1}{2}$)$f_0$ spurious response, and the natural frequency of which is not affected by the new design.

Another object of the present invention is to provide a tuning fork of good quality that will not cause shock noises if it suffers an external mechanical shock or is dropped.

A further object of the present invention is to provide a tuning fork which is strong in construction without causing any deformation of the tuning fork vibrator or the mounting arrangement thereof.

A still further object of the present invention is to provide a tuning fork which is compact in size, easy to assemble and excellent in characteristics.

SUMMARY OF THE INVENTION

According to the present invention, there is provided a tuning fork comprising: a tuning fork vibrator of approximately U shape having a pair of vibratory reeds extending from the end of a stem; at least one of piezoelectric element mounted on one of the vibrating reeds of the tuning fork vibrator; and a housing for accommodating the tuning fork vibrator therein, provided with at least two terminal pieces, one electrically connected to the stem of the tuning fork vibrator and the other electrically connected to the piezoelectric element, and characterized in that the tuning fork vibrator is supported on the housing through a damping member which is firmly mounted on the stem of the tuning fork vibrator and at least one part of which damping piece extends in the same direction as the vibrating reeds of the tuning fork vibrator, the damping piece being designed to cancel or reduce the ($\frac{1}{2}$)$f_0$ spurious response without impeding the normal vibration of the tuning fork vibrator, with the result that the tuning fork can be minimized in size.

In another embodiment of the present invention, the damping member is mounted on the housing by at least one spacer made of elastic material, to prevent the tuning fork from shock or impact caused by an external force.

BRIEF DESCRIPTION OF THE FIGURES

These and other objects and features of the present invention will become apparent from the following description taken in conjunction with the preferred embodiment thereof with reference to the accompanying drawings, in which:

Before the description of the present invention proceeds in connection with FIGS. 4 to 18, it is to be noted that like parts are designated by like reference numerals throughout several views of the accompanying drawings.

Referring to FIGS. 4 to 7, as a first embodiment of the present invention, there is shown a tuning fork comprising a tuning fork vibrator 11 made of metal and including a stem 11a, a pair of vibratory reeds 11b, 11c and a connecting piece 11d, and a pair of piezoelectric elements 12a, 12b mounted on the vibrating node portion of the vibratory reeds 11b, 11c. The connecting piece 11d is mounted on a damping member 13 made of metal and including a base portion 13a, a pair of damping piece 13b, 13c and a connecting piece 13d together with a common terminal piece 14, and mounted on a housing 15 made of dielectric and including a mounting base 15a and a covering case 15b. A pair of terminal pieces 16, 17 penetrate the mounting base 15a, and a spacer 18 for accommodating the tuning fork vibrator 11 and the damping member 13 is mounted on the base 15a of the housing 15. The damping member 13 is for damping the vibration of the tuning fork vibrator 11 so as to prevent the vibration from spreading into the housing 15. The stem 11a of the tuning fork vibrator 11 is electrically connected with the common terminal piece 14 via the connecting pieces 11d and 13, and the terminal pieces 16, 17 of the housing 15 are electrically connected to the piezoelectric elements 12b and 12a, respectively. The tuning fork vibrator 11 is formed in U shape, consisting of the stem 11a and the pair of vibratory reeds 11b, 11c, and, also, the damping member 13 is formed in approximately the same U shape as the tuning fork vibrator 11, consisting of the base portion 13a and the pair of damping pieces 13b, 13c corresponding to the stem 11a and pair of vibratory reeds 11b, 11c. The connecting piece 11d of the tuning fork vibrator 11 is connected with the connecting piece 13d of the damping member 13 by means of spot welding, a bonding agent or the like in such an arrangement that the pair of vibrating reeds 11b, 11c are positioned above and spaced apart from the corresponding damping pieces 13b, 13c in parallel relation to each other, as shown in FIGS. 5 and 6. The stem 11a, the pair of vibratory reeds 11b, 11c and the connecting piece 11d of the tuning fork vibrator 11 are punched from a sheet of metal plate as one integral unit, and the piezoelectric elements 12a, 12b, each made of titanate or the like, are pasted by binding agent or the like on the node portion of the vibratory reeds 11b, 11c. Also, the common terminal piece 14 connected to the damping member 13 is integrally formed with the base portion 13a, the pair of damping pieces 13b, 13c and the connecting piece 13d of the damping member 13 from one sheet of metal plate by punching, and is located at the center of the base portion 13a to be joined to the connecting piece 13d. The common terminal piece 14 has a square-rod shape and is mounted on the mounting base 15a to extend vertically through the mounting base 15a. Terminal pieces 16, 17 are all mounted in apertures in the mounting base 15a in a line with the common terminal piece 14. The three terminals 14, 16 and 17 are parallel and coplanar, and each extends through the mounting base 15a, as shown in FIGS. 5 and 6. The pair of damping pieces 13b, 13c are positioned above and spaced from the mounting base 15a.

Figure 1:
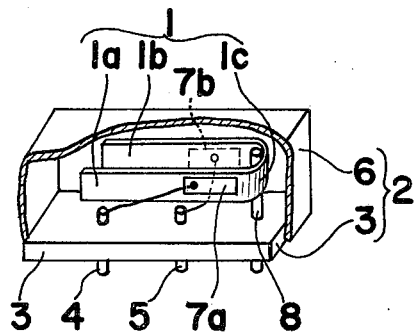
FIG. 1 is a perspective view, partially broken away, showing one tuning fork of conventional type, as referred to above.
Figure 2:
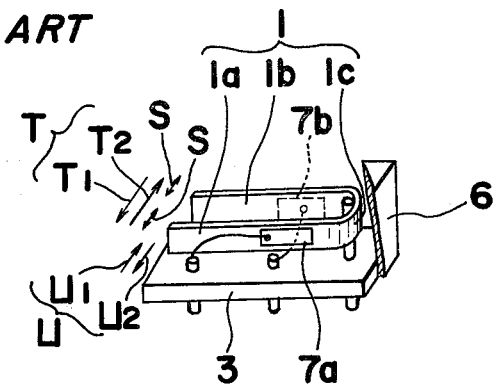
FIG. 2 is a similar view of FIG. 1 for illustrating the $(\frac{1}{2})f_0$ spurious response of the tuning fork of FIG. 1.

The pair of terminal pieces 16, 17 are electrically connected to the piezoelectric elements and 12a, 12b respectively while the common terminal piece 14 is electrically connected to the stem 11a by the damping member 13 and the pair of connecting pieces 11d, 13d, an electrical input signal being applied between one of the terminal pieces 16, 17 and the common terminal piece 14, and the output signal being obtained from the other terminal piece 16 or 17. It is to be noted that the damping member 13 is firmly secured on the stem 11a of the tuning fork vibrator 11 by the pair of connecting pieces 11d, 13d and that the pair of damping pieces 13b, 13c extend in the same direction as the vibratory reeds 11b, 11c of the tuning fork vibrator 11, so as to induce a damping counter-vibration at a frequency to be applied according to the vibration of the tuning fork vibrator 11 such as will cancel the $(\frac{1}{2})f_0$ supurious response of the tuning fork vibrator 11.

The mounting base 15a is molded together with the common terminal piece 14 and the pair of terminal pieces 16, 17 into a rectangular plate of insulating resin, all of terminal pieces 14, 16, 17 being arranged in a line with each other and extending vertically through the mounting base 15a. On the mounting base 15a the spacer 18, of square rod shape, is mounted parallel to the base portion 13a of the damping member 13 to support the free ends of the pair of damping pieces 13b, 13c near the end portion of the mounting base 15a opposite to the end portion provided with the common terminal piece 14. The free ends of the pair of damping pieces 13b, 13c are mounted on the spacer 18 by means of spot welding, a bonding agent or the like. The covering case 15b of the housing 15 is mounted on the mounting base 15a to cover the tuning fork vibrator 11, and an external electrical circuit not shown in the drawings may be connected to the exterior ends of the terminal pieces 14, 16, 17.

Figure 3:
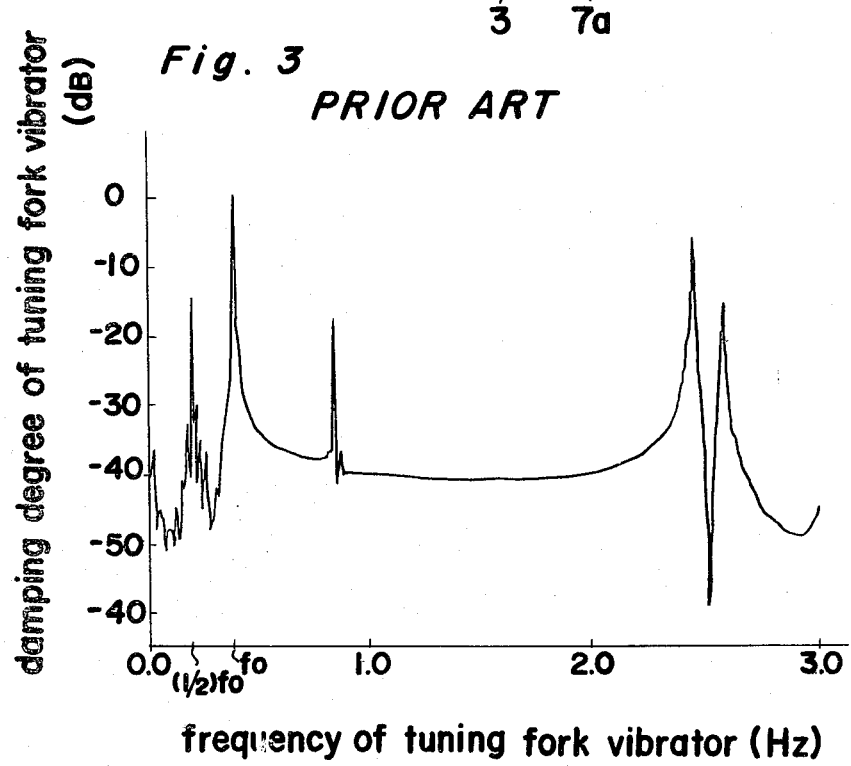
FIG. 3 is a graph showing the relation between the degrees of damping and the frequency of the tuning fork of FIG. 1.
Figure 4:
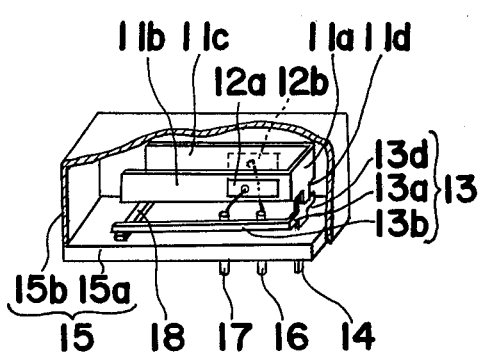
FIG. 4 is a perspective view, partially broken away, showing a tuning fork according to one preferred embodiment of the present invention.
Figure 5:
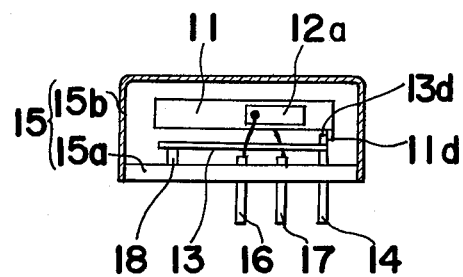
FIG. 5 is a vertical cross-sectional view of the tuning fork of FIG. 4.
Figure 6:
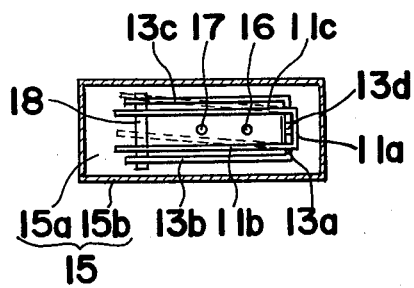
FIG. 6 is a horizontal cross-sectional view of the tuning fork of FIG. 4.
Figure 7:
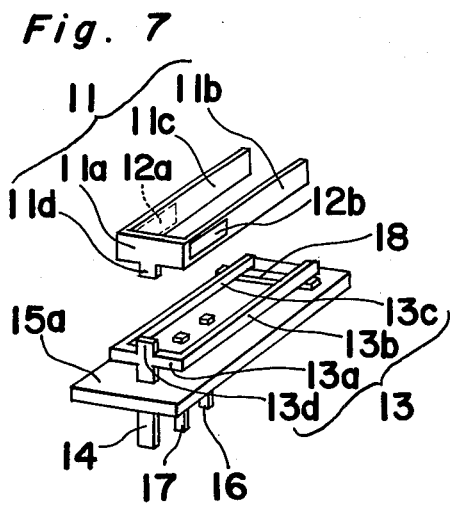
FIG. 7 is a perspective view of the tuning fork vibrator and damping pieces employed in the tuning fork of FIG. 4.
Figure 8:
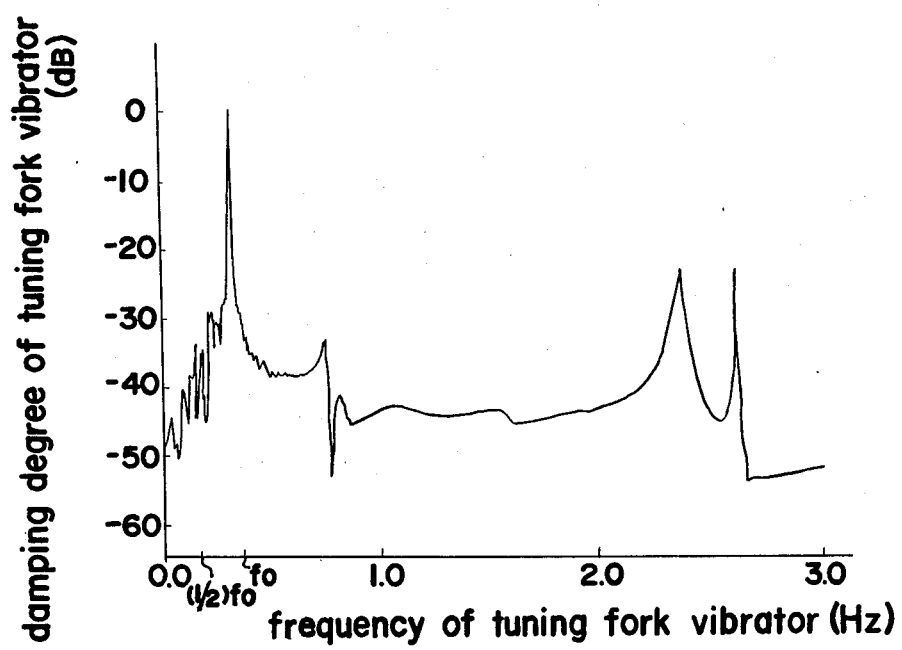
FIG. 8 is a graph showing the relation between the degree of damping and the frequency of the tuning fork of FIG. 4.

With the above construction, the tuning fork is operated by an electrical input signal to be applied to the one terminal piece 16 or 17 to generate the vibrations of the tuning fork vibrator 11 which include a natural vibration frequency $f_0$ of the tuning fork vibrator and the $(\frac{1}{2})f_0$ spurious response, as shown in FIG. 3, and are transmitted to the housing 15 by the damping member 13 which is vibrated with such a frequency as will cancel the $(\frac{1}{2})f_0$ spurious response so as to negate the vibrations caused by the twisting between the housing 15 and the tuning fork vibrator 11, with the result is that the output signal obtained from the other terminal piece 17 or 16 excludes the $(\frac{1}{2})f_0$ spurious response from the vibration of the tuning fork vibrator 11, as shown in FIG. 8.

The well-known phenomenon of insertion loss occurs with tuning forks: when the tuning fork is connected with an electrical circuit assembly, a certain portion of the energy of the signal supplied to the input terminal of the tuning fork is consumed as a result. This insertion loss can be a problem within the range of the frequencies in practical use. Therefore, when the damping member 13 is provided between the housing 15 and the tuning fork vibrator 11, one is naturally anxious about increasing the insertion loss in the range of application frequencies. Experiment on the tuning fork of the present invention has shown, however, that the insertion loss can be disregarded in practice, and reduction of approximately 10 to 20 dB of the damping degree of the tuning fork vibrator in the vicinity of approximately $(\frac{1}{2})f_0$ spurious response for the tuning fork vibrator 11 of the present invention can be attained without causing any harmful influence on the natural vibration of the tuning fork vibrator 11. As is shown in FIG. 8, the $(\frac{1}{2})f_0$ spurious response can be almost completely removed from the vibration of the tuning fork even under the influence of the insertion loss caused by miniaturizing the tuning fork.

Figure 9:
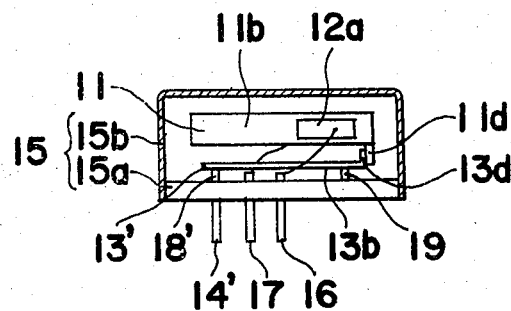
FIGS. 9, 11, 13, 15 and 17 are, respectively, vertical cross-sectional views, partially broken away, showing tuning forks according to other embodiments of the present invention.
Figure 10:
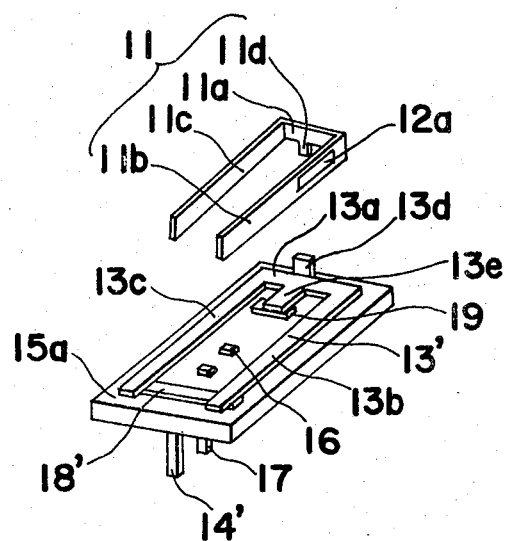
FIGS. 10, 12, and 18 are, respectively, perspective views of the tuning fork vibrator and damping pieces employed in the tuning forks of FIGS. 9, 11, and 17.

Referring to FIGS. 9 and 10, showing a modification of the tuning fork of FIGS. 4 to 7, the damping member 13' is supported on the mounting base 15a at both end portions by a pair of spacers 18', 19, one of which 19 is disposed between the mounting base 15a and a support piece 13e provided on the base portion 13a of the damping member 13', while the other 18' of which a metallic plate disposed between the mounting base 15a and the free ends of the pair of damping pieces 13b, 13c and in good electrical contact with the common terminal piece 14' which is mounted on the mounting base 15a in order to electrically connect an external circuit with the stem 11a of the tuning fork vibrator 11 through the pair of connecting pieces 11d, 13d, the damping member 13' and the spacer 18'. The damping member 13', including the horizontal support piece 13e, is formed from one sheet of metallic plate material punched into approximately U shape, the connecting piece 13d being bent up and is to provide damping effective to cancel the $(\frac{1}{2})f_0$ spurious response of the tuning fork vibrator 11. Both of the spacers 18', 19 are secured by means of a bonding agent or the like to the mounting base 15a, and the damping member 13' is secured by means of spot welding, a bonding agent or the like to the spacers 18', 19. Also, the connecting piece 13d is bent at a right angle from the base portion 13a of the damping member 13' to meet the connecting piece 11d of the tuning fork vibrator 11 and is secured by spot welding to the connecting piece 11d. The rest of the construction of the tuning fork of this embodiment is similar to that of the tuning fork of the first embodiment, and the tuning fork of this embodiment is operated in the same manner as the tuning fork of the first embodiment to obtain the same effect.

Figure 11:
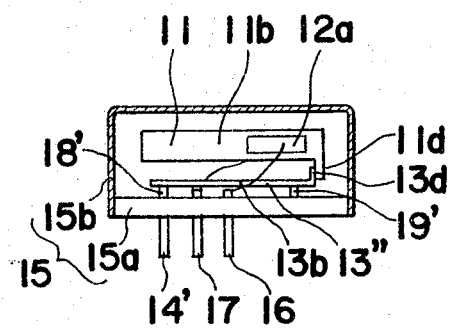
Figure 12:
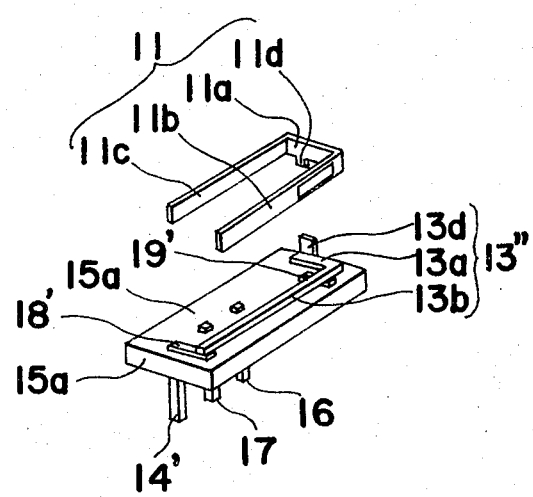

Referring to FIGS. 11 and 12, showing a modification of the tuning fork of FIGS. 9 and 10, the damping member 13" secured to the tuning fork vibrator 11 is designed with only one of the damping piece 13b, and which is supported on the mounting base 15a on spacers 18', 19' and extends in the same direction as the vibratory reeds 11b, 11c of the tuning fork vibrator 11. Spacers 18', 19' are provided at both ends of the damping piece 13", so as to provide damping effective to cancel the $(\frac{1}{2})f_0$ spurious response of the tuning fork vibrator. The tuning fork of this embodiment has, also, the same damping effects as the tuning fork of the first embodiment.

Figure 13:
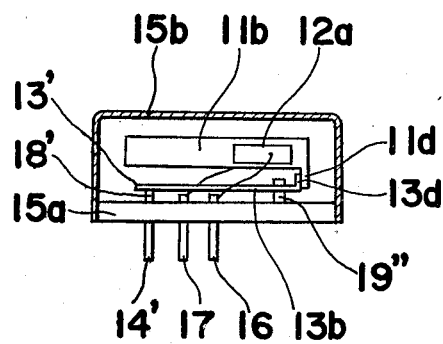
Figure 14:
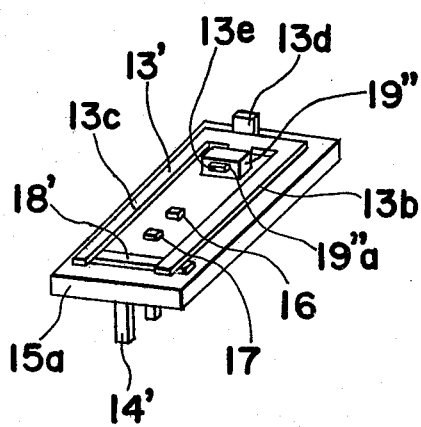
FIGS. 14 and 16 are perspective views of the damping pieces employed in the tuning forks of FIGS. 13 and 15, respectively.

Referring to FIGS. 13 and 14, showing another modification of the tuning fork of FIGS. 9 and 10, one of the spacers 19" to be provided between the support piece 13e and the mounting base 15a is made of an elastic damper material such as rubber or the like. It is fixed to the mounting base 15a by adhesive, and is provided with a hole 19"a to engage the support piece 13e of the damping member 13'. Thus the damping member 13' is supported on the mounting base 15a by the metal spacer 18', to which are secured the damping pieces 13b, 13c, and by the rubber spacer 19" fitted with the support piece 13e, so as to provide damping characteristics effective to cancel the spurious response of the tuning fork vibrator 11. The support piece 13e of the damping member 13' is firmly ensconced in the hole 19a" of the rubber spacer 19" so that, even if external shocks are applied to the tuning fork, the rubber spacers can absorb the shocks, thus preventing the tuning fork vibrator from picking up the shock noises.

Figure 15:
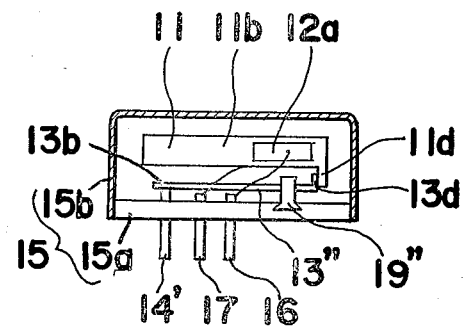
Figure 16:
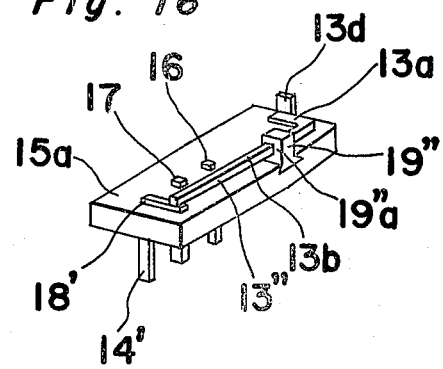

Referring to FIGS. 15 and 16, showing a modification of the tuning fork of FIGS. 13 and 14, one damping piece is omitted and the damping member 13" with the remaining damping piece 13b is supported on the mounting base 15a by the metal spacer 18' and the rubber spacer 19". The rubber spacer 19" has a hole 19a" in which the damping piece 13b is firmly ensconced, whereby the damping member 13" is provided with damping characteristics capable of cancelling the $(\frac{1}{2})f_0$ spurious response of the tuning fork vibrator. Therefore, the same effect is obtainable with the tuning fork of this embodiment as with the tuning fork of the first embodiment.

Figure 17:
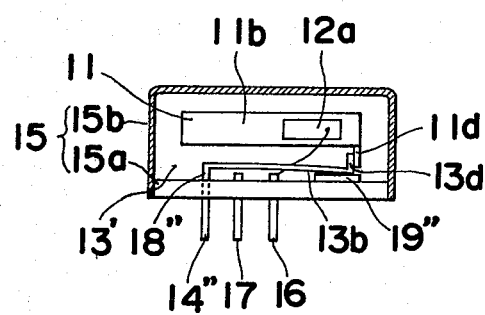
Figure 18:
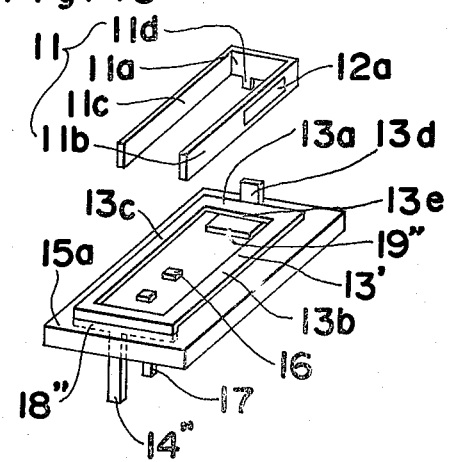

Referring to FIGS. 17 and 18, showing a modification of the tuning fork of FIGS. 13 and 14, the metal spacer 18" is integrally formed with the damping member 13' as one unit having the configuration of a rectangle. That damping member 13', the spacer 18" and the common terminal piece 14" are punched out from one sheet of metallic plate as one unit. The rubber spacer 19" is mounted by means of a bonding agent between the mounting base 15a and the base portion 13a of the damping member 13', of which the support piece 13e provided in the tuning fork of FIGS. 13 and 14 is eliminated. The lower portion of the metal spacer 18" is buried within the mounting base 15a. The damping member 13' has damping characteristics capable of cancelling the $(\frac{1}{2})f_0$ spurious response, so that the same effect is obtainable by the tuning fork of this embodiment as with the tuning fork of the first embodiment.

It is to be noted that, for the purpose of facilitating the assembly of the tuning fork, the tuning fork vibrator 11 and the damping member 13 can be punched out from one sheet of metallic plate as one unit, and, the common terminal piece 14 can be integrally formed with the damping member by the punching operation of one sheet of metallic plate. It is also to be noted that, for the purpose of simplifying the construction of the tuning fork, one of the spacers can be omitted, so that the damping member is supported only by one spacer on the mounting base with the other portions being kept free from the mounting base, or either end of it can be mounted directly on the mounting base at end. In addition, the tuning fork vibrator can be operated with only one piezoelectric element mounted on the vibrating node portion of the vibratory reed and connected to a terminal piece in the mounting base, in association with the common terminal piece connected to the stem of the tuning fork vibrator.

Also, the damping member may be firmly secured by any means to the stem of the tuning fork vibrator and may have more than two damping pieces that extend in the same direction as the vibratory reeds of the tuning fork vibrator to produce damping to eliminate the $(\frac{1}{2})f_0$ spurious response from the vibration of the tuning fork vibrator.

As apparent from the above description, the tuning fork of the present invention is operated to produce an ideal output of natural vibration frequency $f_0$ while the $(\frac{1}{2})f_0$ spurious response is eliminated by the damping member provided with the tuning fork vibrator. Accordingly, since the tuning fork vibrator is damped by the damping member, the tuning fork can be miniaturized without producing the $(\frac{1}{2})f_0$ spurious response, and made strong without causing any deformation of the tuning fork vibrator or of the mounting arrangement thereof. In addition thereto, when the damping member together with the tuning fork vibrator is mounted on the mounting base by means of a spacer of elastic material capable of absorbing an external shock, the tuning fork can be prevented from picking up the external shock noises and effectively damped against damage caused by dropping the tuning fork.

Although the invention has been described above in connection with several preferred embodiments of it, many variations and modifications thereof will now be apparent to those skilled in the art, and it is preferred that the scope of this invention be limited not by the details of the above preferred embodiments, but only by the appended claims.

What is claimed is:

1. A tuning fork comprising:

a tuning fork vibrator of approximately U shape having a stem and a pair of vibratory arms extending from said stem;

a piezoelectric element disposed on one of said vibratory arms of said tuning fork vibrator;

a damping member firmly secured to said stem of said tuning fork vibrator; said damping member comprising at least one damping piece extending in the same direction as said vibratory arms of said tuning fork vibrator, said damping piece being of such shape and material as will cause it to cancel the $(\frac{1}{2})f_0$ spurious response of said tuning fork vibrator during vibration of said tuning fork vibrator;

a housing for accommodating said tuning fork vibrator; said damping member being secured to said housing; and a first and a second terminal piece secured to said housing; said first terminal piece being electrically connected to said stem of said tuning fork vibrator through said damping member and said second terminal piece being electrically connected to said piezoelectric element.

2. A tuning fork as claimed in claim 1, wherein said damping member is secured to said housing by at least a first spacer.

3. A tuning fork as claimed in claim 2 or 6, wherein said first spacer is made of elastic material.

4. A tuning fork as claimed in claim 1, wherein said damping member has a base portion, and said first terminal piece supports said base portion of said damping member.

5. A tuning fork as claimed in claim 2, wherein said first terminal piece is mechanically connected to said first spacer.

6. A tuning fork as claimed in claim 2, wherein said damping member has a base portion and said first spacer is disposed between said base portion of said damping member and said housing, said damping piece having an end portion remote from said base portion, a second spacer being disposed between said end portion of said damping piece and said housing.

7. A tuning fork as claimed in claim 1 or 6, wherein said housing comprises a base mounting of a resinous material and wherein said terminal pieces are secured to said mounting base by means of said mounting base being molded with said terminal pieces already in place.

8. A tuning fork as claimed in claim 1 or 6, wherein said damping member has a base portion and is one integral and continuous unit, including said base portion and said damping piece thereof, said damping member being formed from a punched sheet of metal plate.

9. A tuning fork as claimed in claim 6, wherein said damping member, said first terminal piece and said second spacer are one integral and continuous piece punched from a sheet of metal plate; said housing having a mounting base and said damping member having a base portion; said first terminal piece being secured to said mounting base of said housing, and said base portion of said damping member being secured to said mounting base of said housing by means of at least one of said first and second spacers being secured to said mounting base; said first spacer being made of elastic material.

* * * * *